(12) United States Patent
Lee et al.

(10) Patent No.: US 12,100,756 B2
(45) Date of Patent: Sep. 24, 2024

(54) HIGH ELECTRON MOBILITY TRANSISTOR DEVICE HAVING A BARRIER LAYER WITH A PROTRUDING PORTION

(71) Applicant: United Microelectronics Corp., Hsinchu (TW)

(72) Inventors: Hao-Ming Lee, Hsinchu County (TW); Ta Kang Lo, Taoyuan (TW); Tsai-Fu Chen, Hsinchu (TW); Shou-Wei Hsieh, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 554 days.

(21) Appl. No.: 17/528,159

(22) Filed: Nov. 16, 2021

(65) Prior Publication Data
US 2023/0129579 A1  Apr. 27, 2023

(30) Foreign Application Priority Data
Oct. 26, 2021  (CN) .......................... 202111245701.8

(51) Int. Cl.
*H01L 29/778* (2006.01)
*H01L 29/06* (2006.01)
(Continued)

(52) U.S. Cl.
CPC ...... *H01L 29/7786* (2013.01); *H01L 29/0607* (2013.01); *H01L 29/2003* (2013.01);
(Continued)

(58) Field of Classification Search
CPC ............. H01L 29/7786; H01L 29/0607; H01L 29/2003; H01L 29/401; H01L 29/41775;
(Continued)

(56) References Cited

U.S. PATENT DOCUMENTS

| 11,695,049 B2 * | 7/2023 | Yeh .................. H01L 29/66462 257/76 |
| 11,757,029 B2 * | 9/2023 | Oh .................... H01L 29/66462 257/76 |

(Continued)

FOREIGN PATENT DOCUMENTS

CN           212783460              3/2021

OTHER PUBLICATIONS

Saichiro Kaneko et al., "Current-collapse-free operations up to 850 V by GaN-GIT utilizing hole injection from drain," 2015 IEEE 27th International Symposium on Power Semiconductor Devices & IC's (ISPSD), May 10-14, 2015, pp. 41-44.

*Primary Examiner* — Alonzo Chambliss
(74) *Attorney, Agent, or Firm* — JCIPRNET

(57) ABSTRACT

A high electron mobility transistor (HEMT) device including a substrate, a channel layer, a barrier layer, a p-type gallium nitride (GaN) spacer, a gate electrode, a source electrode, and a drain electrode is provided. The channel layer is disposed on the substrate. The barrier layer is disposed on the channel layer and has a protruding portion. The P-type GaN spacer is disposed on a side wall of the protruding portion. The gate electrode is disposed on the protruding portion and the P-type GaN spacer. The source electrode and the drain electrode are disposed on two sides of the gate electrode.

20 Claims, 13 Drawing Sheets

(51) Int. Cl.
    *H01L 29/20*          (2006.01)
    *H01L 29/40*          (2006.01)
    *H01L 29/417*        (2006.01)
    *H01L 29/423*        (2006.01)
    *H01L 29/66*          (2006.01)

(52) U.S. Cl.
    CPC ...... *H01L 29/401* (2013.01); *H01L 29/41775* (2013.01); *H01L 29/42316* (2013.01); *H01L 29/66462* (2013.01); *H01L 29/7783* (2013.01); *H01L 2924/13064* (2013.01)

(58) Field of Classification Search
    CPC ......... H01L 29/66462; H01L 29/42316; H01L 29/7783; H01L 2924/13064
    See application file for complete search history.

(56) References Cited

U.S. PATENT DOCUMENTS

| | | | | |
|---|---|---|---|---|
| 11,990,539 B2 * | 5/2024 | Yang | .................. | H01L 29/66462 |
| 2009/0267100 A1 * | 10/2009 | Miyake | .................. | B82Y 20/00 |
| | | | | 438/33 |
| 2014/0138747 A1 * | 5/2014 | Lee | ....................... | H01L 29/778 |
| | | | | 257/194 |
| 2014/0302672 A1 * | 10/2014 | Kondo | .............. | H01L 29/41766 |
| | | | | 438/666 |
| 2014/0319584 A1 * | 10/2014 | Cai | .................... | H01L 29/7787 |
| | | | | 257/194 |

* cited by examiner

HIGH ELECTRON MOBILITY TRANSISTOR DEVICE HAVING A BARRIER LAYER WITH A PROTRUDING PORTION

CROSS-REFERENCE TO RELATED APPLICATION

This application claims the priority benefit of China patent application serial no. 202111245701.8, filed on Oct. 26, 2021. The entirety of the above-mentioned patent application is hereby incorporated by reference herein and made a part of this specification.

BACKGROUND

Technical Field

The disclosure relates to a semiconductor device and a manufacturing method thereof, more particularly, the disclosure relates to a high electron mobility transistor (HEMT) device and a manufacturing method thereof.

Description of Related Art

Nowadays, after a high electron mobility transistor (HEMT) is being operated, negative electric charges are trapped onto a surface of a barrier layer, which leads to a current collapse phenomenon. The current collapse phenomenon may increase channel resistance of the HEMT, transconductance (gm) of the HEMT may be reduced.

SUMMARY

The disclosure provides a high electron mobility transistor (HEMT) device and a manufacturing method thereof, whereby transconductance of the HEMT may be increased.

In an embodiment of the disclosure, a HEMT device including a substrate, a channel layer, a barrier layer, a p-type gallium nitride (GaN) spacer, a gate electrode, a source electrode, and a drain electrode is provided. The channel layer is disposed on the substrate. The barrier layer is disposed on the channel layer and has a protruding portion. The p-type GaN spacer is disposed on a side wall of the protruding portion. The gate electrode is disposed on the protruding portion and the p-type GaN spacer. The source electrode and the drain electrode are disposed on two sides of the gate electrode.

According to an embodiment of the disclosure, in the HEMT device, the gate electrode may be in direct contact with the protruding portion and the p-type GaN spacer.

According to an embodiment of the disclosure, in the HEMT device, the p-type GaN spacer may be located between a portion of the gate electrode and a portion of the barrier layer.

According to an embodiment of the disclosure, in the HEMT device, a material of the channel layer is, for instance, GaN.

According to an embodiment of the disclosure, in the HEMT device, a material of the barrier layer is, for instance, aluminum gallium nitride (AlGaN).

According to an embodiment of the disclosure, in the HEMT device, a material of the gate electrode may be different from a material of the source electrode and a material of the drain material.

According to an embodiment of the disclosure, in the HEMT device, a work function of the gate electrode may be different from a work function of the source electrode and a work function of the drain electrode.

According to an embodiment of the disclosure, the HEMT device further includes a buffer layer disposed between the channel layer and the substrate.

According to an embodiment of the disclosure, the HEMT device is, for instance, a depletion-mode (D-mode) HEMT device.

In an embodiment of the disclosure, a manufacturing method of a HEMT device is provided, and the manufacturing method includes following steps. A substrate is provided. A channel layer is formed on the substrate. A barrier layer is formed on the channel layer, wherein the barrier layer has a protruding portion. A p-type GaN spacer is formed on a side wall of the protruding portion. A gate electrode is formed on the protruding portion and the p-type GaN spacer. A source electrode and a drain electrode are formed on two sides of the gate electrode.

According to an embodiment of the disclosure, in the manufacturing method of the HEMT device, a method of forming the channel layer is, for instance, an epitaxial growth method.

According to an embodiment of the disclosure, in the manufacturing method of the HEMT device, a method of forming the barrier layer may include following steps. A barrier material layer is formed on the channel layer. The barrier material layer is patterned to form the barrier layer.

According to an embodiment of the disclosure, in the manufacturing method of the HEMT device, a method of forming the barrier material layer is, for instance, an epitaxial growth method.

According to an embodiment of the disclosure, in the manufacturing method of the HEMT device, a method of forming the p-type GaN spacer may include following steps. A p-type GaN material layer is formed. An etch-back process is performed on the p-type GaN material layer to form the p-type GaN spacer.

According to an embodiment of the disclosure, in the manufacturing method of the HEMT device, a method of forming the p-type GaN material layer is, for instance, an epitaxial growth method.

According to an embodiment of the disclosure, in the manufacturing method of the HEMT device, the etch-back process is, for instance, a dry etching process.

According to an embodiment of the disclosure, in the manufacturing method of the HEMT device, a method of forming the gate electrode may include following steps. A first dielectric layer is formed on the barrier layer and the p-type GaN spacer. A first opening is formed in the first dielectric layer, wherein the first opening may expose the protruding portion and the p-type GaN spacer. A first conductive layer is formed on the first dielectric layer and in the first opening. The first conductive layer is patterned to form the gate electrode, wherein the gate electrode may be located in the first opening.

According to an embodiment of the disclosure, in the manufacturing method of the HEMT device, a method of forming the source electrode and the drain electrode may include following steps. A second dielectric layer is formed on the first dielectric layer and the gate electrode. A second opening and a third opening are formed in the second dielectric layer and the first dielectric layer. A second conductive layer is formed on the second dielectric layer and in the second and third openings. The second conductive layer is patterned to form the source electrode and the drain electrode, wherein the source electrode may be located in the second opening, and the drain electrode may be located in the third opening.

According to an embodiment of the disclosure, in the manufacturing method of the HEMT device, a buffer layer is formed on the substrate before the channel layer is formed.

According to an embodiment of the disclosure, in the manufacturing method of the HEMT device, a method of forming the buffer layer is, for instance, an epitaxial growth method.

In view of the above, in the HEMT device and the manufacturing method thereof, the p-type GaN spacer is located on the side wall of the protruding portion of the barrier layer, and the gate electrode is disposed on the protruding portion and the p-type GaN spacer. Thereby, effects of hole injection may be accomplished by a recovery operation performed in a recovery time period. As such, negative electric charges trapped on a surface of the barrier layer may be neutralized or compensated by the holes, so as to resolve the issue of current collapse and increase the transconductance of the HEMT.

To make the above more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

FIG. 1A to FIG. 1L are cross-sectional views illustrating a manufacturing process of a high electron mobility transistor (HEMT) device according to an embodiment of the disclosure. FIG. 2 is a diagram illustrating a voltage of the HEMT device during an operation time period according to an embodiment of the disclosure.

Figure 1A:
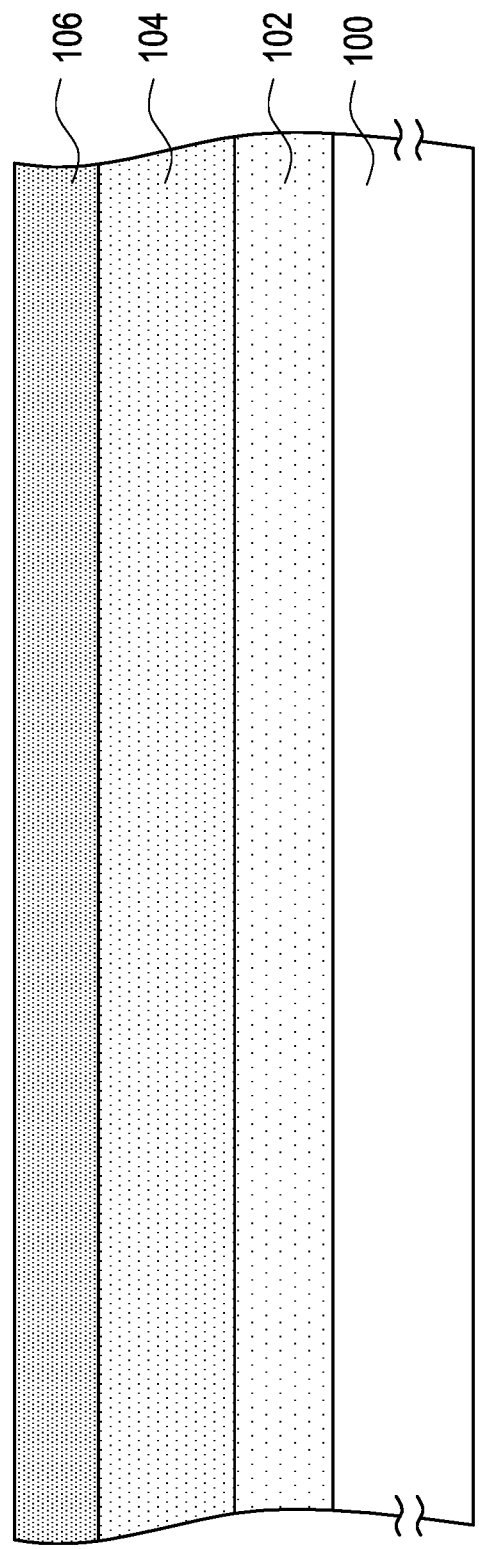
FIG. 1A to FIG. 1L are cross-sectional views illustrating a manufacturing process of a high electron mobility transistor (HEMT) device according to an embodiment of the disclosure.
Figure 2:
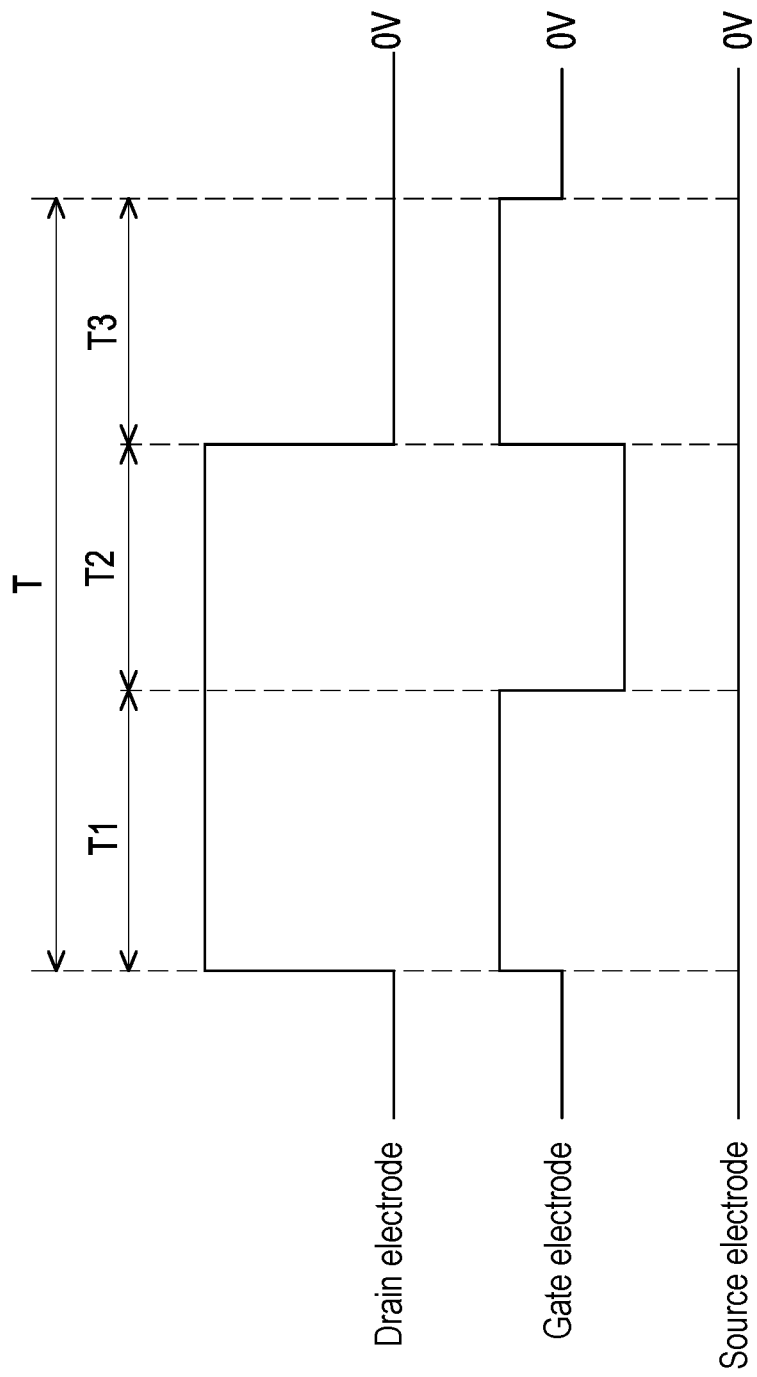
FIG. 2 is a diagram illustrating a voltage of the HEMT device during an operation time period according to an embodiment of the disclosure.

With reference to FIG. 1A, a substrate 100 is provided. The substrate 100 may be a semiconductor substrate, such as a silicon substrate. A buffer layer 102 may be formed on the substrate 100. A method of forming the buffer layer 102 is, for instance, an epitaxial growth method. A channel layer 104 is formed on the substrate 100. In this embodiment, the channel layer 104 may be formed on the buffer layer 102. A material of the channel layer 104 is, for instance, gallium nitride (GaN). A method of forming the channel layer 104 is, for instance, an epitaxial growth method. A barrier material layer 106 may be formed on the channel layer 104. A material of the barrier material layer 106 is, for instance, aluminum gallium nitride (AlGaN). A method of forming the barrier material layer 106 is, for instance, an epitaxial growth method.

Figure 1B:
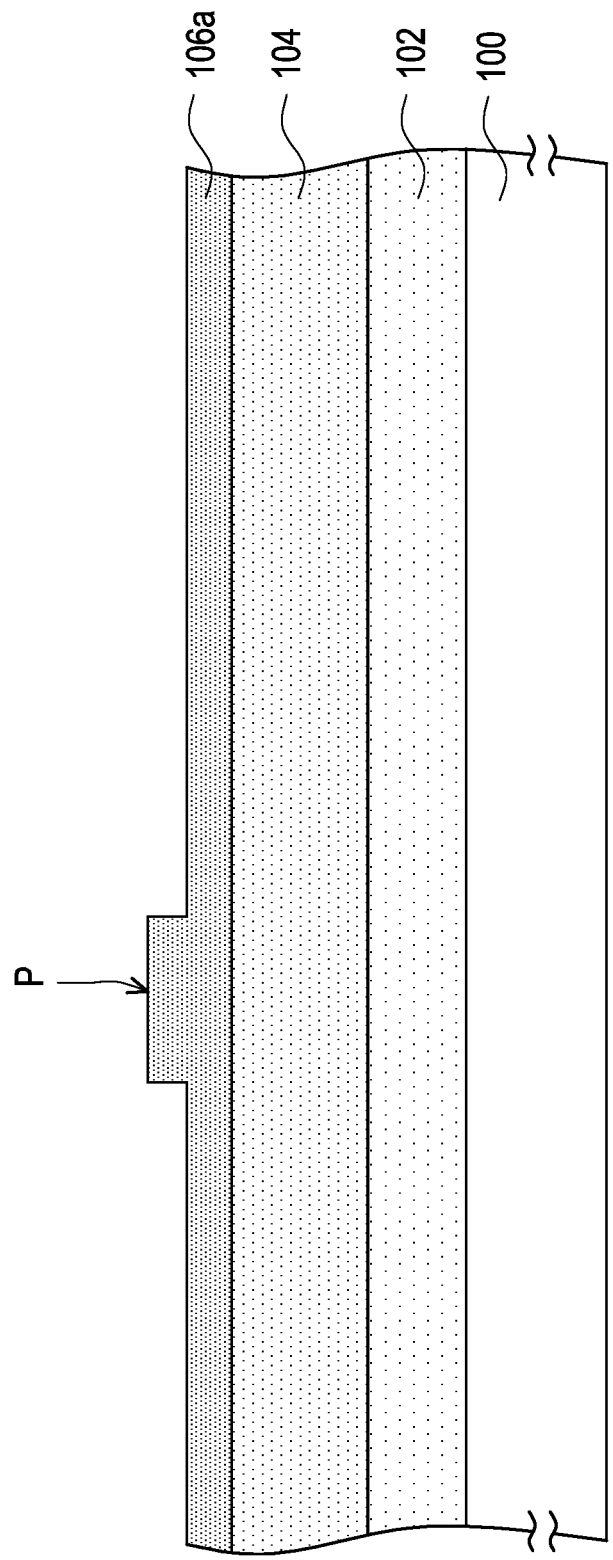

With reference to FIG. 1B, the barrier material layer 106 may be patterned to form a barrier layer 106a. Thereby, the barrier layer 106a may be formed on the channel layer 104, wherein the barrier layer 106a has a protruding portion P. For instance, the barrier material layer 106 may be patterned by performing a photolithography process and an etching process (e.g., a dry etching process). In addition, a material of the barrier layer 106a is, for instance, AlGaN.

Figure 1C:
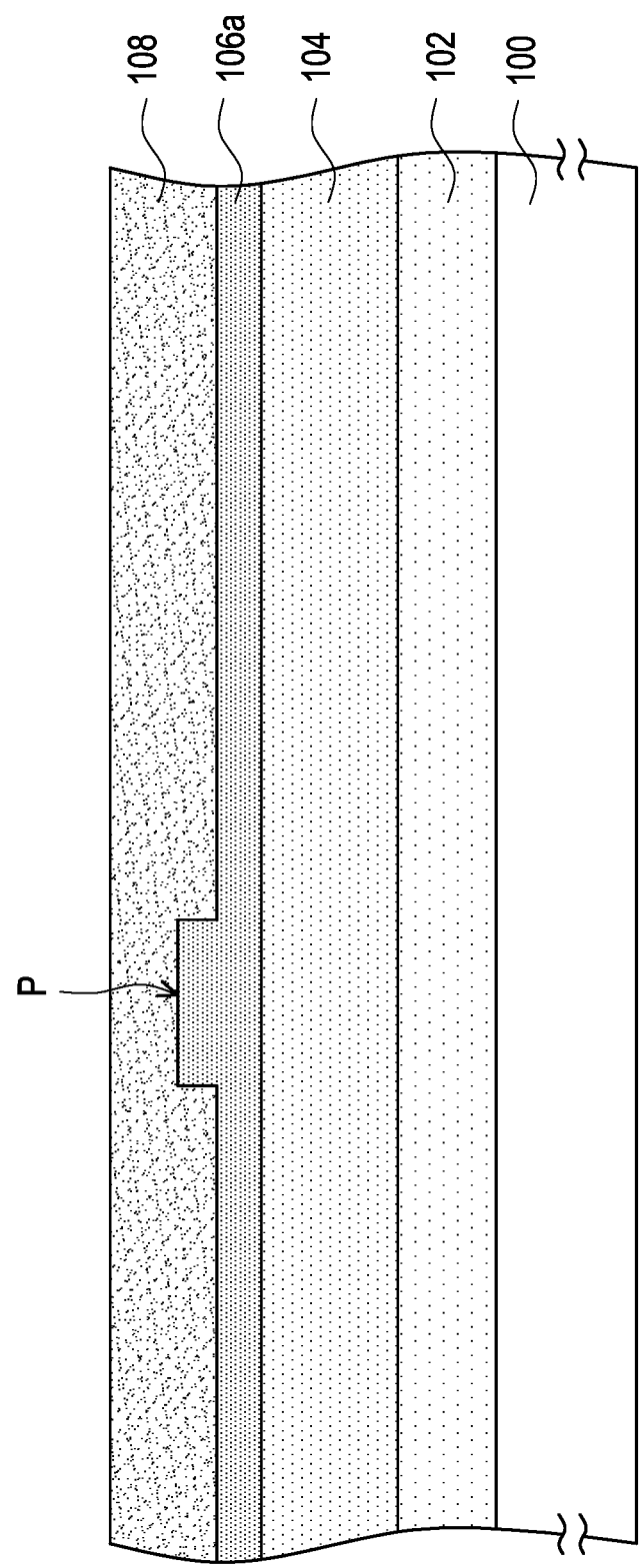

With reference to FIG. 1C, a p-type GaN material layer 108 may be formed. The p-type GaN material layer 108 may have a p-type dopant (e.g., magnesium (Mg)). A method of forming the p-type GaN material layer 108 is, for instance, an epitaxial growth method.

Figure 1D:
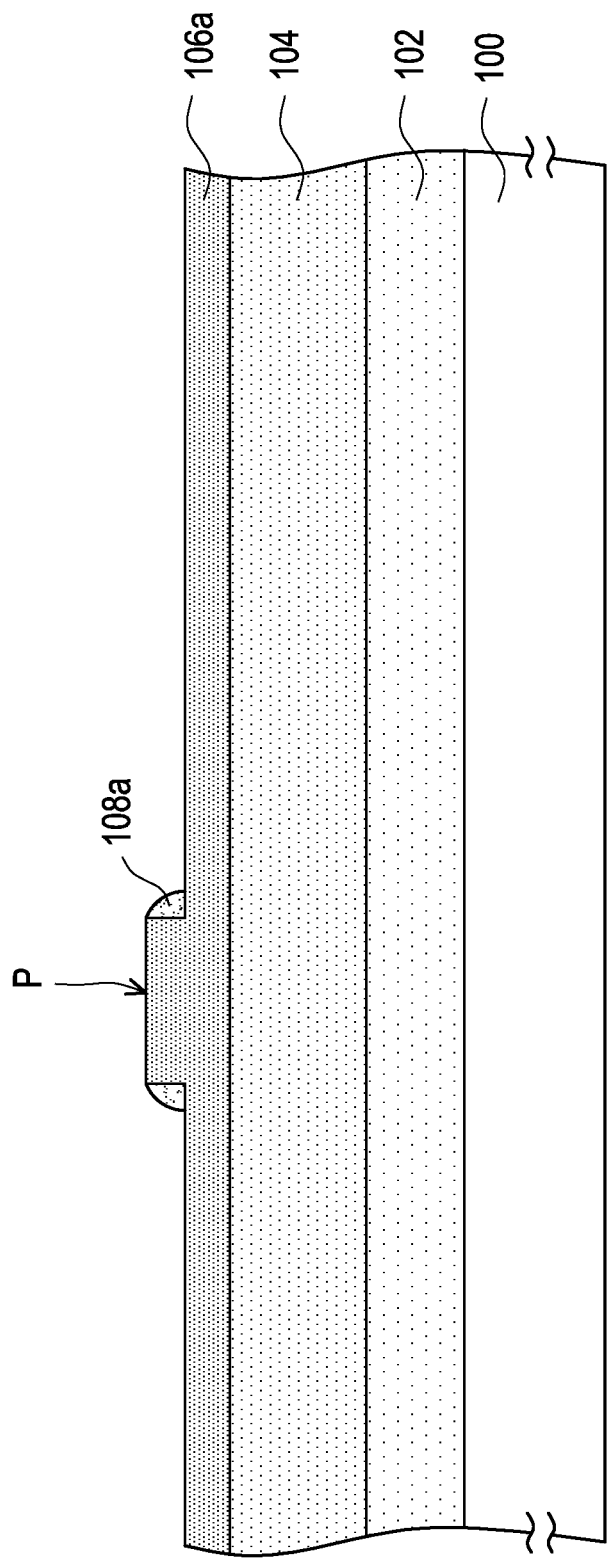

With reference to FIG. 1D, an etch-back process may be performed on the p-type GaN material layer 108 to form a p-type GaN spacer 108a. The p-type GaN spacer 108a may be formed on a side wall of the protruding portion P. The p-type GaN spacer 108a may be located between a portion of a gate electrode 112a and a portion of the barrier layer 106a. The etch-back process is, for instance, a dry etching process.

Figure 1E:
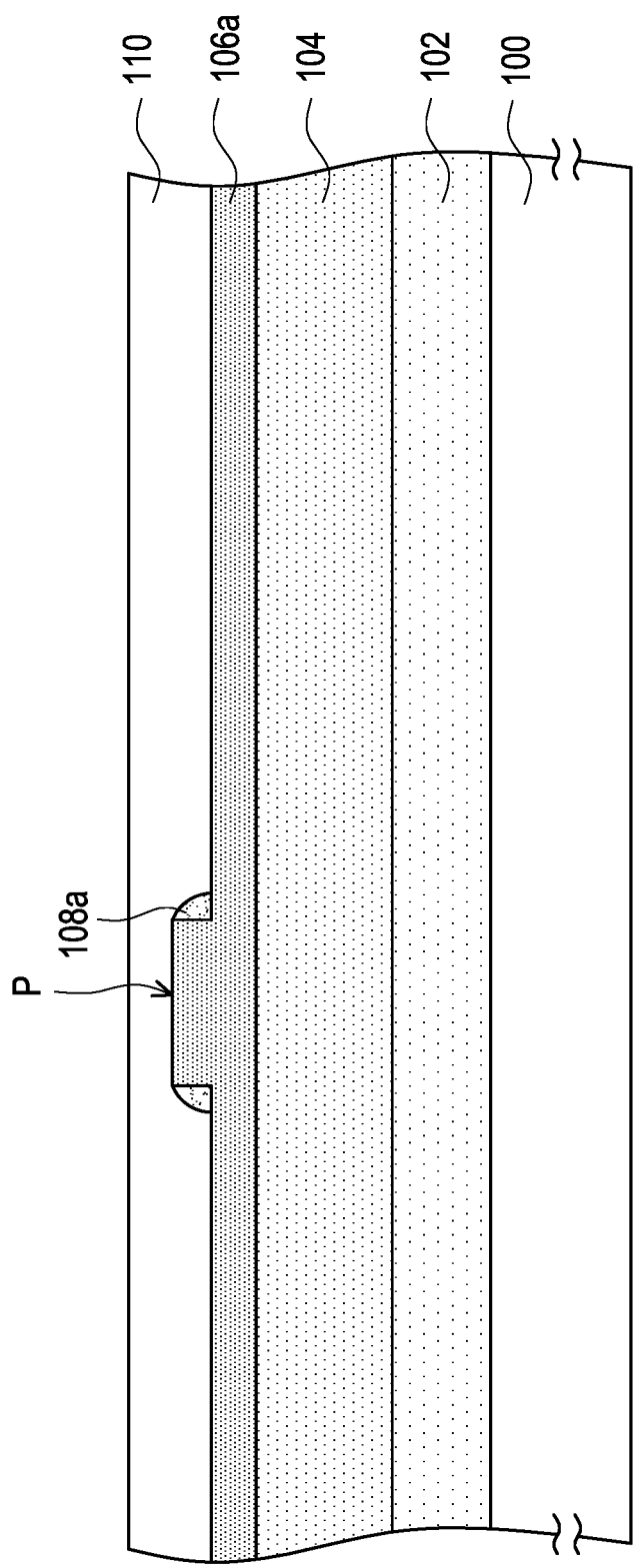

With reference to FIG. 1E, a dielectric layer 110 may be formed on the barrier layer 106a and the p-type GaN spacer 108a. In some embodiments, a material of the dielectric layer 110 is, for instance, silicon oxide, such as tetraethyl orthosilicate (TEOS) silicon oxide, which should however not be construed as a limitation in the disclosure. A method of forming the dielectric layer 110 is, for instance, a chemical vapor deposition (CVD) method.

Figure 1F:
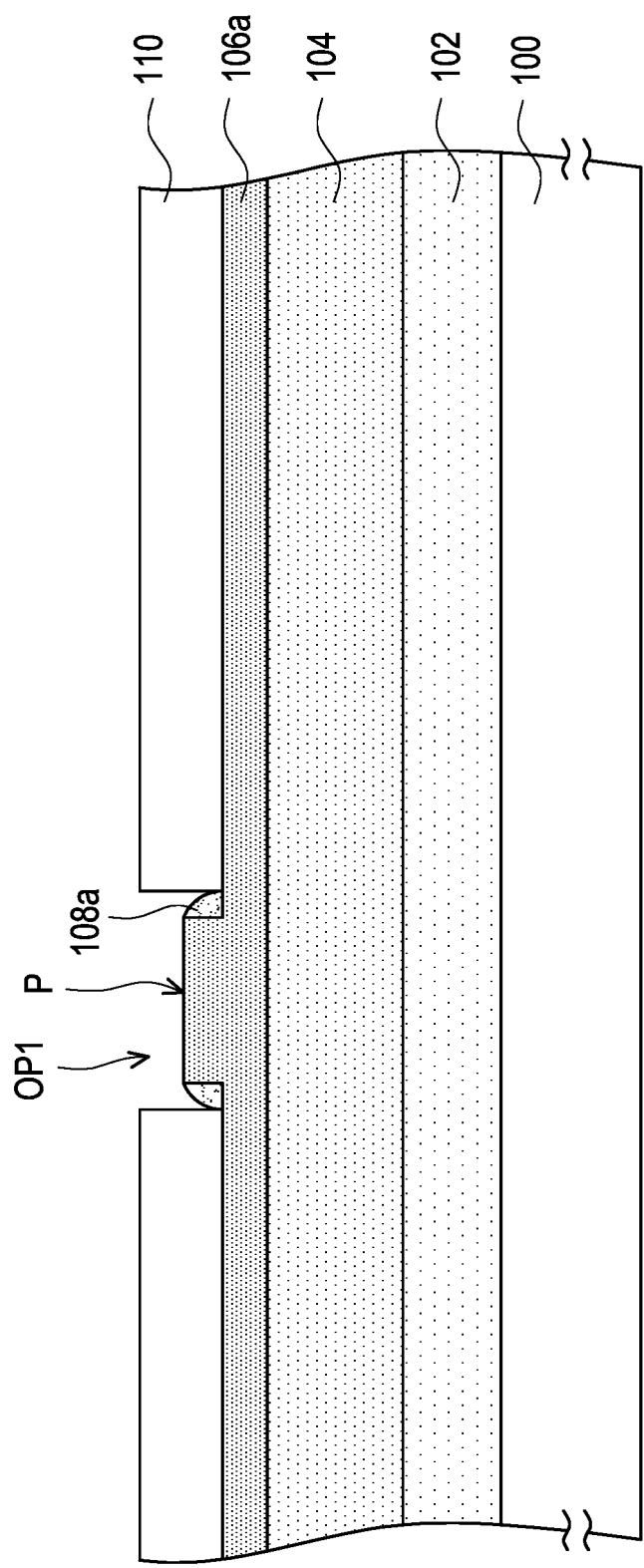

With reference to FIG. 1F, an opening OP1 may be formed in the dielectric layer 110. The opening OP1 may expose the protruding portion P and the p-type GaN spacer 108a. A method of forming the opening OP1 is, for instance, by patterning the dielectric layer 110 through a photolithography process and an etching process (e.g., a dry etching process).

Figure 1G:
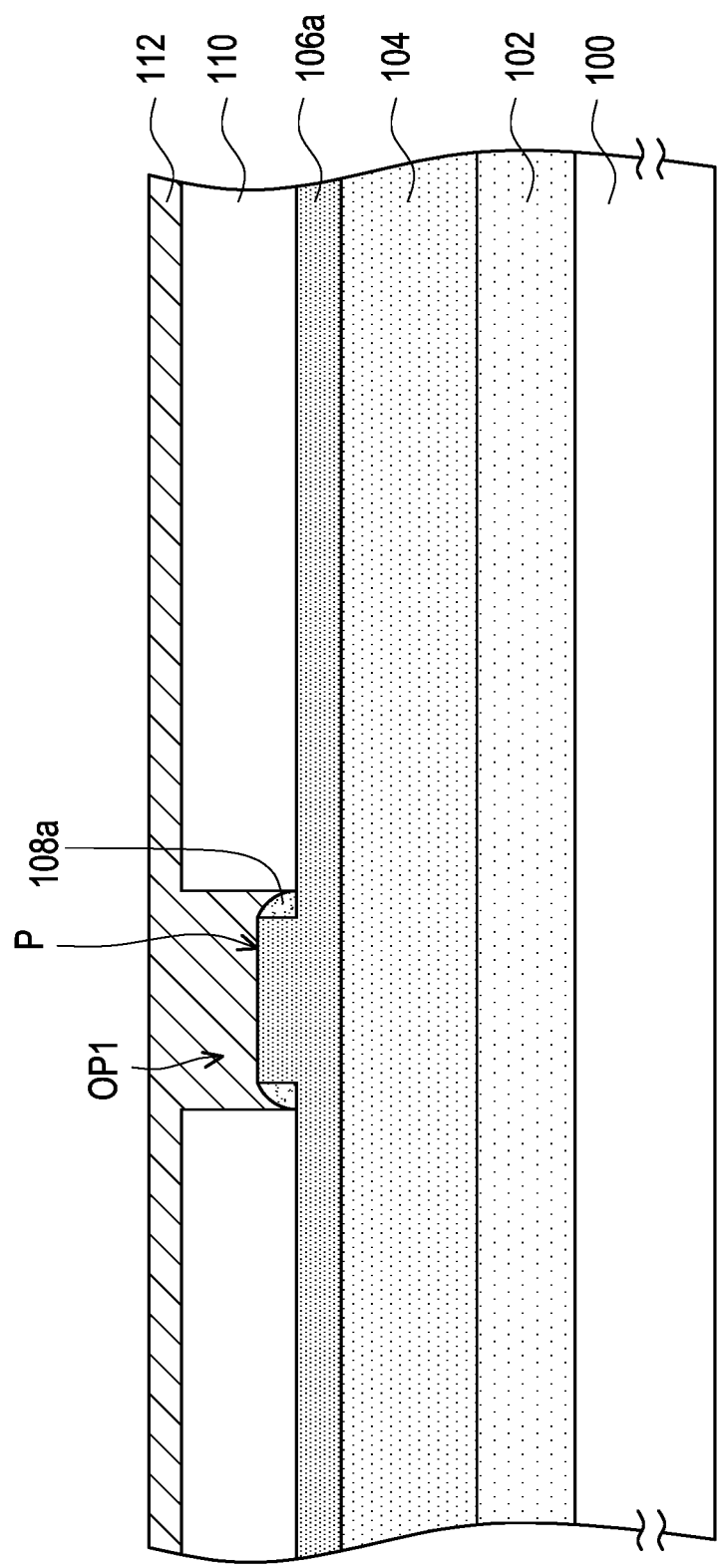

With reference to FIG. 1G, a conductive layer 112 may be formed on the dielectric layer 110 and in the opening OP1. A material of the conductive layer 112, for instance, may serve to generate the Schottky contact. For instance, the material of the conductive layer 112 may be nickel (Ni), gold (Au), or an alloy thereof. A method of forming the conductive layer 112 is, for instance, a physical vapor deposition (PVD) method.

Figure 1H:
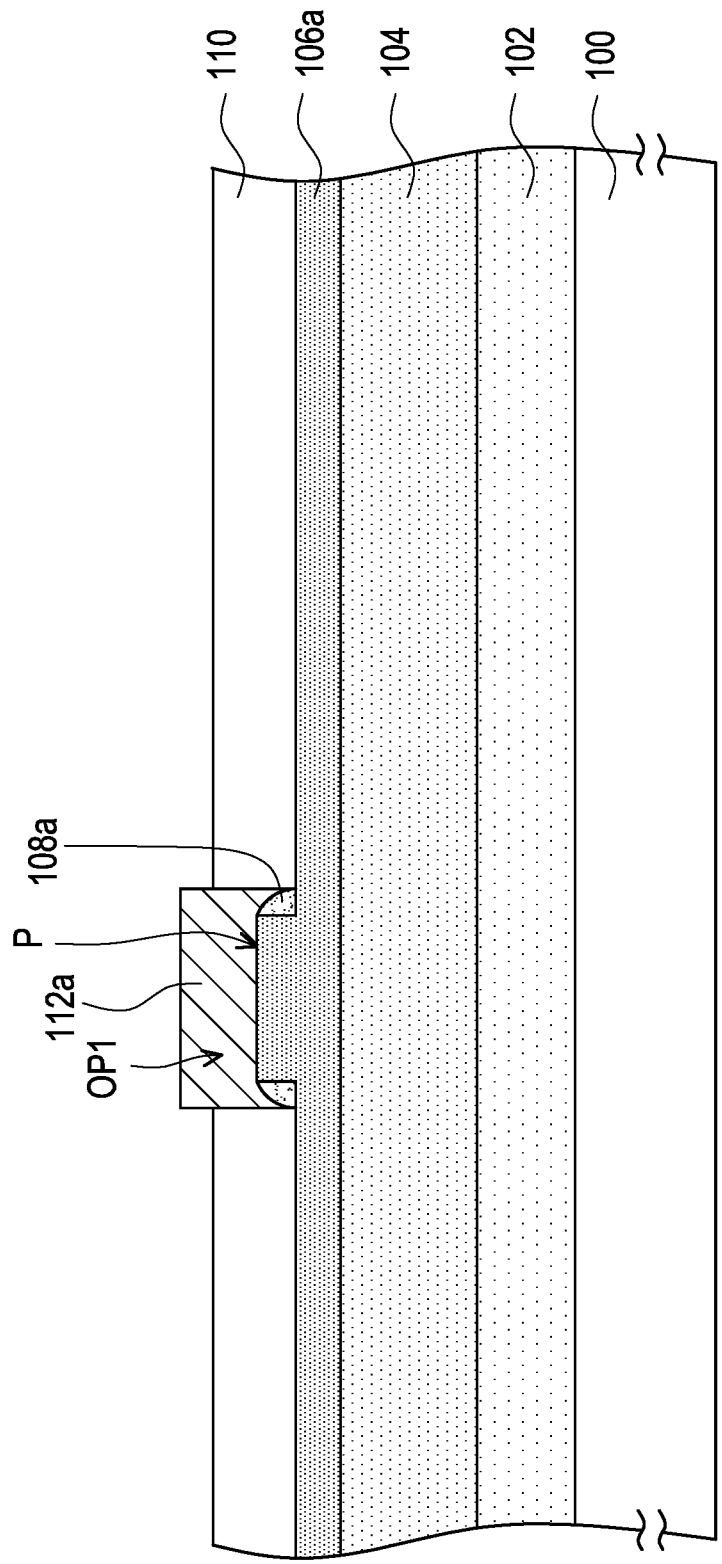

With reference to FIG. 1H, the conductive layer 112 may be patterned to form the gate electrode 112a. The gate electrode 112a may be formed on the protruding portion P and the p-type GaN spacer 108a. Besides, the gate electrode 112a may be in direct contact with the protruding portion P and the p-type GaN spacer 108a. Here, the gate electrode 112a may be located in the opening OP1. For instance, the conductive layer 112 may be patterned by performing a photolithography process and an etching process (e.g., a dry etching process).

Figure 1I:
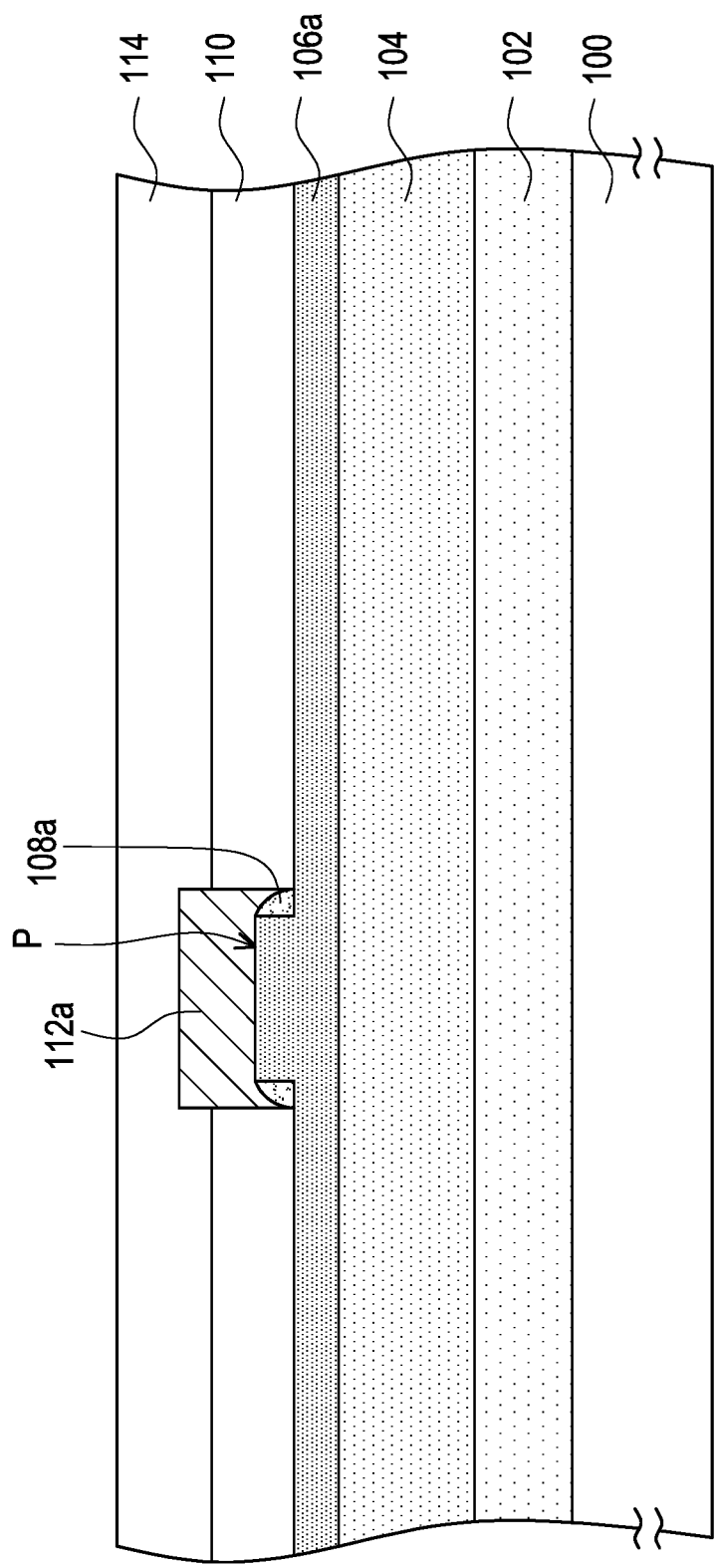

With reference to FIG. 1I, a dielectric layer 114 may be formed on the dielectric layer 110 and the gate electrode 112a. In some embodiments, a material of the dielectric layer 114 is, for instance, silicon oxide (e.g., TEOS silicon oxide), which should however not be construed as a limitation in the disclosure. A method of forming the dielectric layer 114 is, for instance, a CVD method.

Figure 1J:
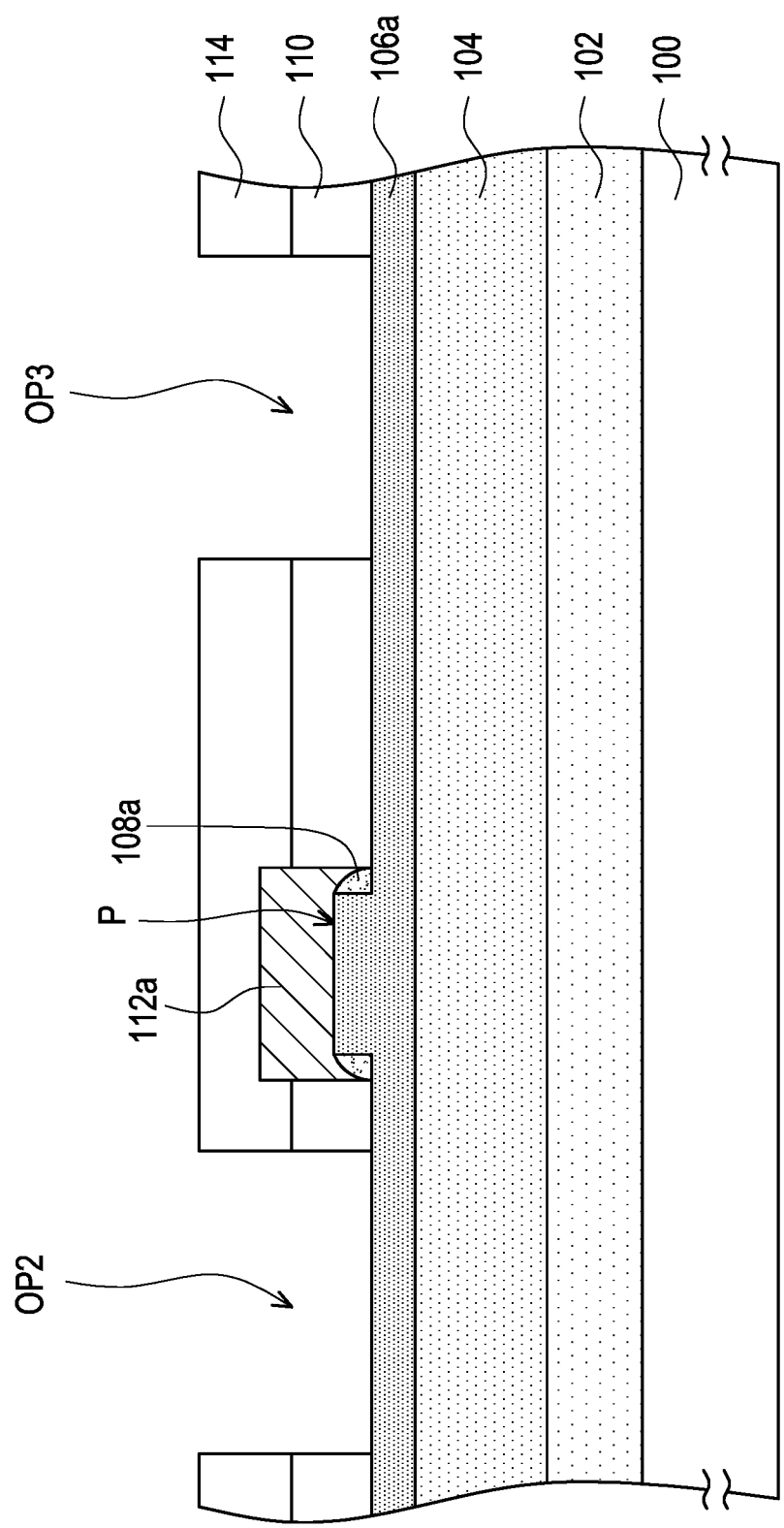

With reference to FIG. 1J, an opening OP2 and an opening OP3 may be formed in the dielectric layer 114 and the dielectric layer 110. In this embodiment, the opening OP2 may expose a portion of the barrier layer 106a, and the opening OP3 may expose another portion of the barrier layer 106a. A method of forming the opening OP2 and the opening OP3 is, for instance, by patterning the dielectric layer 114 and the dielectric layer 110 through a photolithography process and an etching process (e.g., a dry etching process).

Figure 1K:
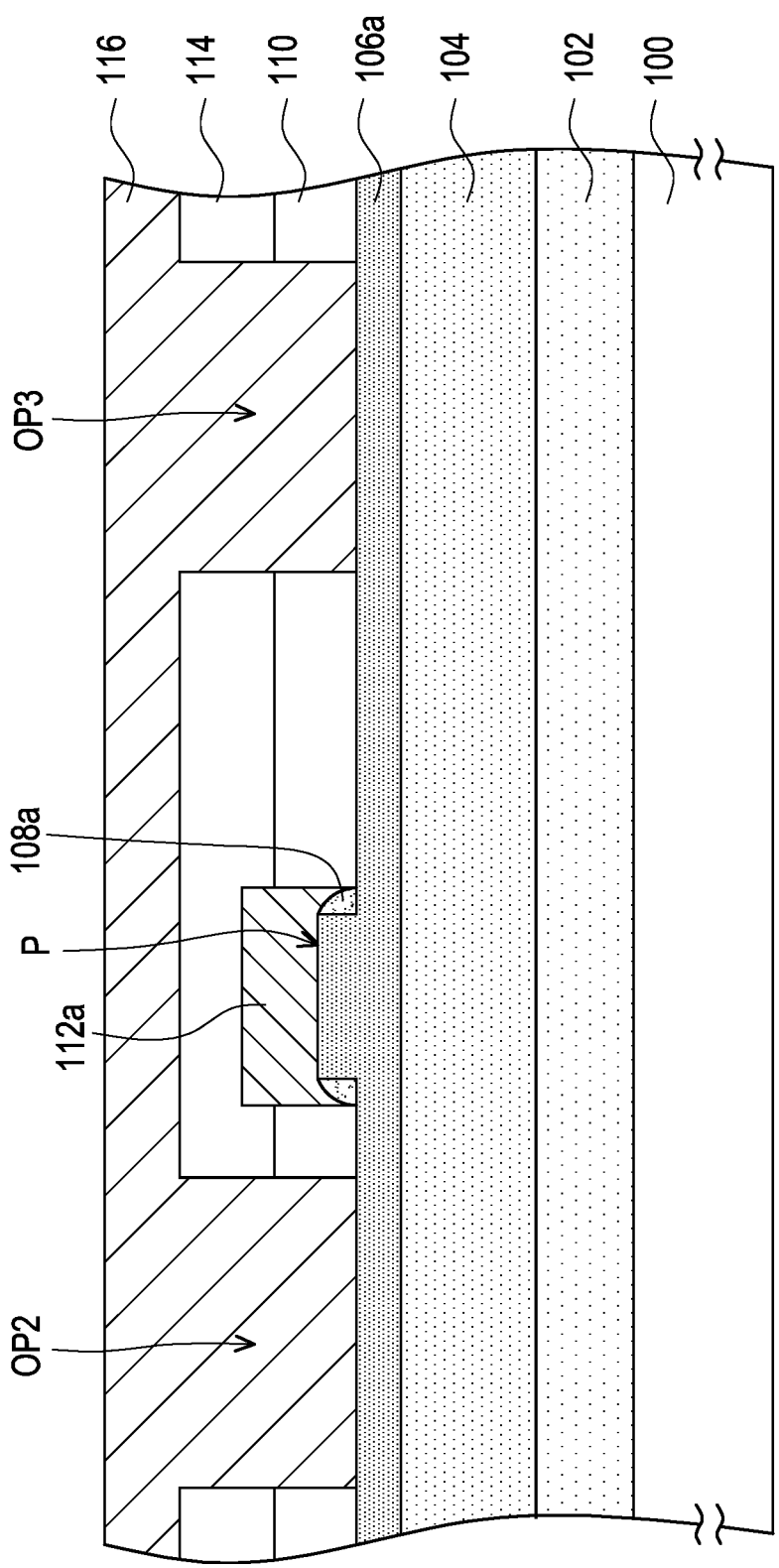

With reference to FIG. 1K, a conductive layer 116 may be formed on the dielectric layer 114 and in the opening OP2 and the opening OP3. A material of the conductive layer 116 may, for instance, serve to generate Ohmic contact. For instance, the material of the conductive layer 116 may be titanium (Ti). A method of forming the conductive layer 116 is, for instance, a PVD method.

Figure 1L:
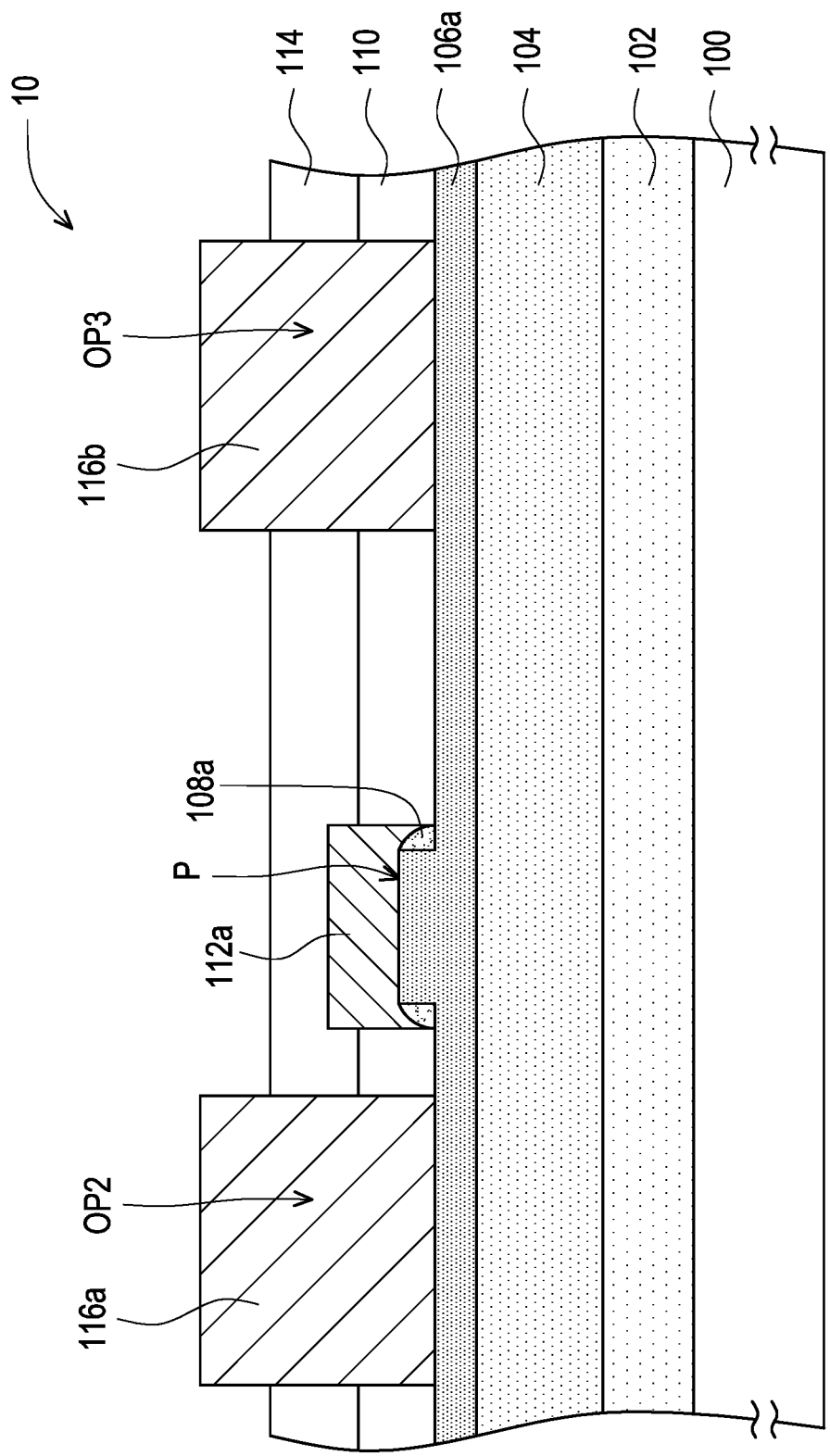

With reference to FIG. 1L, the conductive layer 116 may be patterned to form a source electrode 116a and a drain electrode 116b. The source electrode 116a and the drain electrode 116b may be formed on two sides of the gate electrode 112a. The source electrode 116a may be located in the opening OP2, and the drain electrode 116b may be located in the opening OP3. In addition, a material of the gate electrode 112a may be different from a material of the source electrode 116a and a material of the drain electrode 116b. In addition, a work function of the gate electrode 112a may be different from a work function of the source electrode 116a and a work function of the drain electrode 116b.

The HEMT device 10 provided in the previous embodiment will be described with reference to FIG. 1L. In addition, the method pf forming the HEMT device 10 is exemplified above, which should however not be construed as a limitation in the disclosure.

With reference to FIG. 1L, the HEMT device 10 includes the substrate 100, the channel layer 104, the barrier layer 106a, the p-type GaN spacer 108a, the gate electrode 112a, the source electrode 116a, and the drain electrode 116b. In some embodiments, the HEMT device may be a deletion-mode (D-mode) HEMT device. The channel layer 104 is disposed on the substrate 100. The barrier layer 106a is disposed on the channel layer 104 and has the protruding portion P. The p-type GaN spacer 108a is arranged on the side wall of the protruding portion P. The gate electrode 112a is disposed on the protruding portion P and the p-type GaN spacer 108a. The source electrode 116a and the drain electrode 116b are disposed on two sides of the gate electrode 112a. In addition, the HEMT device 10 may further include a buffer layer 102. The buffer layer 102 is disposed between the channel layer 104 and the substrate 100. In addition, the materials of the components, the arrangement manner of the components, the methods of forming the components, and effects of the components in the HEMT device 10 are elaborated in the previous embodiment and thus will not be further described hereinafter.

An operation method of the HEMT device 10 provided in the previous embodiment will be described with reference to FIG. 2.

With reference to FIG. 2, an operation time period T of the HEMT device 10 may include an on period T1, an off period T2, and a recovery time period T3. During the on period T1, a positive voltage may be applied to the drain electrode 116b, a positive voltage may be applied to the gate electrode 112a, and a voltage of 0 volt (V) may be applied to the source electrode 116a, so that the HEMT device 10 may be turned on.

During the off period T2, a positive voltage may be applied to the drain electrode 116b, a negative voltage may be applied to the gate electrode 112a, and a voltage of 0V may be applied to the source electrode 116a, so that the HEMT device 10 may be turned off. In addition, during the off period T2, electrons are injected into the barrier layer 106a from the gate electrode 112a, and the electrons are trapped at an interface between the barrier layer 106a and the dielectric layer 110. As a result, the negative electric charges are trapped on the surface of the barrier layer, thus resulting in an issue of current collapse.

In the recovery time period T3, a voltage of 0V may be applied to the drain electrode 116b, a positive voltage may be applied to the gate electrode 112a, and a voltage of 0V may be applied to the source electrode 116a, whereby the holes may be injected into the barrier layer 106a from the p-type GaN spacer 108a to perform the recovery operation on the HEMT device 10. As such, negative electric charges trapped in the interface between the barrier layer 106a and the dielectric layer 110 may be neutralized or compensated by the holes, and the issue of current collapse may be further resolved.

According to the previous embodiments, in the HEMT device 10 and the manufacturing method thereof, the p-type GaN spacer 108a is located on the side wall of the protruding portion P of the barrier layer 106a, and the gate electrode 112a is disposed on the protruding portion P and the p-type GaN spacer 108a. Thereby, the effects of hole injection may be accomplished by the recovery operation performed in the recovery time period T3. As such, the negative electric charges trapped on the surface of the barrier layer 106a may be neutralized or compensated by the holes, so as to resolve the issue of current collapse and increase the transconductance of the HEMT.

To sum up, in the HEMT device and the manufacturing method thereof, the p-type GaN spacer is located on the side wall of the protruding portion of the barrier layer, and the gate electrode is disposed on the protruding portion and the p-type GaN spacer. Thereby, the effects of hole injection may be accomplished by the recovery operation performed in the recovery time period. As such, the negative electric charges trapped on the surface of the barrier layer may be neutralized or compensated by the holes, so as to resolve the issue of current collapse and increase the transconductance of the HEMT.

It will be apparent to those skilled in the art that various modifications and variations can be made to the disclosed embodiments without departing from the scope or spirit of the disclosure. In view of the foregoing, it is intended that the disclosure covers modifications and variations provided they fall within the scope of the following claims and their equivalents.

What is claimed is:

1. A high electron mobility transistor device, comprising:
   a substrate;
   a channel layer, disposed on the substrate;
   a barrier layer, disposed on the channel layer and having a protruding portion;
   a p-type gallium nitride spacer, disposed on a side wall of the protruding portion;
   a gate electrode, disposed on the protruding portion and the p-type gallium nitride spacer; and
   a source electrode and a drain electrode, disposed on two sides of the gate electrode.

2. The high electron mobility transistor device according to claim 1, wherein the gate electrode is in direct contact with the protruding portion and the p-type gallium nitride spacer.

3. The high electron mobility transistor device according to claim 1, wherein the p-type gallium nitride spacer is located between a portion of the gate electrode and a portion of the barrier layer.

4. The high electron mobility transistor device according to claim 1, wherein a material of the channel layer comprises gallium nitride.

5. The high electron mobility transistor device according to claim 1, wherein a material of the barrier layer comprises aluminum gallium nitride.

6. The high electron mobility transistor device according to claim 1, wherein a material of the gate electrode is different from a material of the source electrode and a material of the drain material.

7. The high electron mobility transistor device according to claim 1, wherein a work function of the gate electrode is different from a work function of the source electrode and a work function of the drain electrode.

8. The high electron mobility transistor device according to claim 1, further comprising:
a buffer layer, disposed between the channel layer and the substrate.

9. The high electron mobility transistor device according to claim 1, wherein comprising the high electron mobility transistor device is a depletion-mode high electron mobility transistor device.

10. A manufacturing method of a high electron mobility transistor device, comprising:
providing a substrate;
forming a channel layer on the substrate;
forming a barrier layer on the channel layer, wherein the barrier layer has a protruding portion;
forming a p-type gallium nitride spacer on a side wall of the protruding portion;
forming a gate electrode on the protruding portion and the p-type gallium nitride spacer; and
forming a source electrode and a drain electrode on two sides of the gate electrode.

11. The manufacturing method according to claim 10, wherein a method of forming the channel layer comprises an epitaxial growth method.

12. The manufacturing method according to claim 10, wherein a method of forming the barrier layer comprises:
forming a barrier material layer on the channel layer; and
patterning the barrier material layer to form the barrier layer.

13. The manufacturing method according to claim 12, wherein a method of forming the barrier material layer comprises an epitaxial growth method.

14. The manufacturing method according to claim 10, wherein a method of forming the p-type gallium nitride spacer comprises:

forming a p-type gallium nitride material layer; and
performing an etch-back process on the p-type gallium nitride material layer to form the p-type gallium nitride spacer.

15. The manufacturing method according to claim 14, wherein a method of forming the p-type gallium nitride material layer comprises an epitaxial growth method.

16. The manufacturing method according to claim 14, wherein the etch-back process comprises a dry etching process.

17. The manufacturing method according to claim 10, wherein a method of forming the gate electrode comprises:
forming a first dielectric layer on the barrier layer and the p-type gallium nitride spacer;
forming a first opening in the first dielectric layer, wherein the first opening exposes the protruding portion and the p-type gallium nitride spacer;
forming a first conductive layer on the first dielectric layer and in the first opening; and
patterning the first conductive layer to form the gate electrode, wherein the gate electrode is located in the first opening.

18. The manufacturing method according to claim 17, wherein a method of forming the source electrode and the drain electrode comprises:
forming a second dielectric layer on the first dielectric layer and the gate electrode;
forming a second opening and a third opening in the second dielectric layer and the first dielectric layer;
forming a second conductive layer on the second dielectric layer and in the second and third openings; and
patterning the second conductive layer to form the source electrode and the drain electrode, wherein the source electrode is located in the second opening, and the drain electrode is located in the third opening.

19. The manufacturing method according to claim 10, further comprising:
forming a buffer layer on the substrate before forming the channel layer.

20. The manufacturing method according to claim 19, wherein a method of forming the buffer layer comprises an epitaxial growth method.

\* \* \* \* \*